US009857999B2

United States Patent
Main et al.

(10) Patent No.: US 9,857,999 B2
(45) Date of Patent: Jan. 2, 2018

(54) DATA RETENTION CHARGE LOSS SENSOR

(71) Applicant: Western Digital Technologies, Inc., Irvine, CA (US)

(72) Inventors: Dale Charles Main, La Canada-Flintridge, CA (US); Dean Mitcham Jenkins, La Canada-Flintridge, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 51 days.

(21) Appl. No.: 14/936,353

(22) Filed: Nov. 9, 2015

(65) Prior Publication Data

US 2017/0131924 A1    May 11, 2017

(51) Int. Cl.
| | | |
|---|---|---|
| G06F 3/06 | (2006.01) | |
| G06F 12/00 | (2006.01) | |
| G06F 11/30 | (2006.01) | |
| G11C 16/06 | (2006.01) | |
| G11C 16/34 | (2006.01) | |

(52) U.S. Cl.
CPC .......... *G06F 3/0619* (2013.01); *G06F 3/0659* (2013.01); *G06F 3/0679* (2013.01); *G06F 11/30* (2013.01); *G06F 12/00* (2013.01); *G11C 16/06* (2013.01); *G11C 16/34* (2013.01); *G06F 2206/1014* (2013.01)

(58) Field of Classification Search
None
See application file for complete search history.

(56) References Cited

U.S. PATENT DOCUMENTS

| | | | | | |
|---|---|---|---|---|---|
| 4,181,865 | A * | 1/1980 | Kohyama | .............. | G11C 19/36 327/208 |
| 6,661,724 | B1 * | 12/2003 | Snyder | .................... | G11C 7/04 365/185.28 |
| 7,102,675 | B1 * | 9/2006 | Tokunaga | .............. | G03B 13/36 348/297 |
| 2005/0024968 | A1 * | 2/2005 | Lee | ........................ | G11C 16/30 365/218 |
| 2006/0242326 | A1 * | 10/2006 | Camiel | .................... | G06F 1/14 709/246 |
| 2007/0104009 | A1 * | 5/2007 | McCollum | .............. | G11C 7/04 365/222 |
| 2008/0027670 | A1 * | 1/2008 | Cheng | ...................... | G01K 7/00 702/136 |

(Continued)

OTHER PUBLICATIONS

Dengtao Zhao, et al., U.S. Appl. No. 14/026,017, filed Sep. 13, 2013, 22 pages.

*Primary Examiner* — Mano Padmanabhan
*Assistant Examiner* — Jean Edouard
(74) *Attorney, Agent, or Firm* — Chang & Hale LLP

(57) ABSTRACT

Systems and methods are disclosed for estimating charge loss in solid-state memory devices using electrical sensors. A data storage device includes a solid-state non-volatile memory comprising a plurality of memory cells, a sensor configured to hold an electric charge, and a controller. The controller is configured to charge the sensor to a first charge level at a first point in time, determine a second charge level of the sensor at a second point in time, after a time period from the first point in time, and refresh data stored in the memory cells based at least in part on the determined second charge level.

26 Claims, 9 Drawing Sheets

(56) References Cited

U.S. PATENT DOCUMENTS

| | | | |
|---|---|---|---|
| 2008/0158977 A1* | 7/2008 | Jeon | G11C 16/28 |
| | | | 365/185.18 |
| 2009/0161466 A1* | 6/2009 | Hamilton | G11C 16/10 |
| | | | 365/222 |
| 2010/0165689 A1* | 7/2010 | Rotbard | G11C 11/56 |
| | | | 365/45 |
| 2010/0283759 A1* | 11/2010 | Iso | G06F 3/0416 |
| | | | 345/174 |
| 2012/0224425 A1* | 9/2012 | Fai | G11C 11/5642 |
| | | | 365/185.09 |
| 2012/0239976 A1* | 9/2012 | Cometti | G11C 16/26 |
| | | | 714/24 |
| 2013/0007543 A1* | 1/2013 | Goss | G11C 16/3418 |
| | | | 714/718 |
| 2013/0258770 A1* | 10/2013 | Goss | G11C 16/26 |
| | | | 365/185.02 |
| 2013/0275829 A1* | 10/2013 | Sridhara | G06F 11/1048 |
| | | | 714/755 |
| 2013/0295697 A1 | 11/2013 | Hanan et al. | |
| 2014/0310445 A1 | 10/2014 | Fitzpatrick et al. | |

* cited by examiner

DATA RETENTION CHARGE LOSS SENSOR

BACKGROUND

Field

This disclosure relates to electrical sensors. More particularly, the disclosure relates to systems and methods for estimating charge loss in a solid-state memory using electrical sensors.

Description of Related Art

Certain solid-state memory devices, such as flash drives, store information in an array of memory cells constructed with floating gate transistors. Integrity of data stored in solid-state memory cells can be affected by various factors, including temperature exposure and time.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1A:
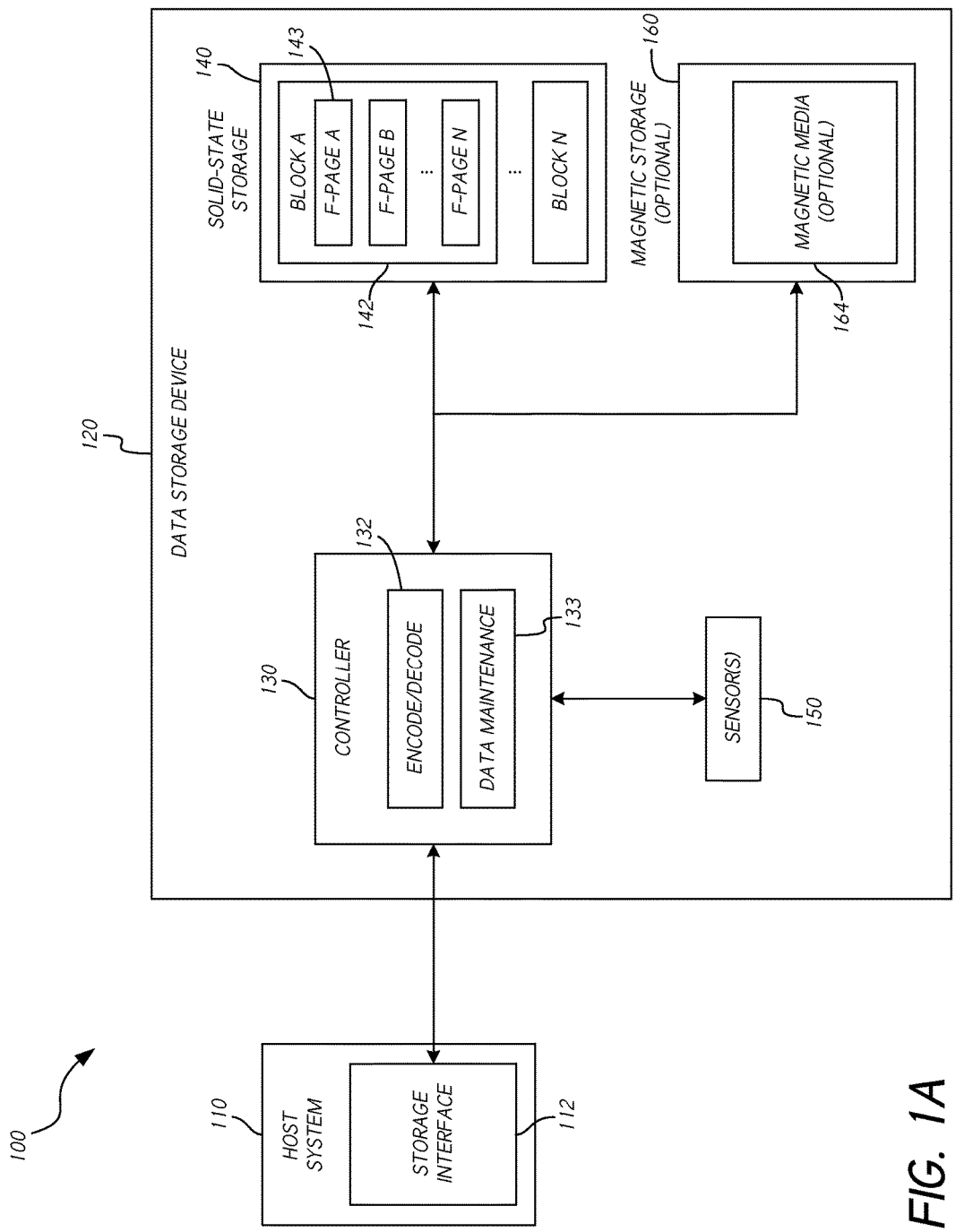
FIGS. 1A and 1B are block diagrams representing embodiments of data storage systems according to one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to charge loss estimation in solid-state memory.

As used in this application, "solid-state memory," "non-volatile solid-state memory," "non-volatile memory," "NVM," or variations thereof may refer to solid-state memory such as NAND flash. However, the systems and methods of this disclosure may also be useful in more conventional hard drives and hybrid drives (or any data storage devices) including both solid-state and hard drive components. Solid-state memory may comprise a wide variety of technologies, such as flash integrated circuits, Phase Change Memory (PC-RAM or PRAM), Programmable Metallization Cell Random Access Memory (RAM) (PMC-RAM or PMCm), Ovonic Unified Memory (OUM), Resistance RAM (RRAM), NAND memory, NOR memory, EEPROM, Ferroelectric RAM (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Overview

The present disclosure provides systems and methods for estimating charge loss in solid-state memory cells using an electrical sensor device. Although certain embodiments are disclosed herein in the context of NAND-type solid-state memory devices, it should be understood that principles and embodiments disclosed herein may be applicable to systems implementing any type of solid-state memory. Certain embodiments comprise a sensor device that is configured to provide temperature and/or time-related data retention and/or charge loss information relating to one or more solid-state memory cells without the need for persistent power.

Generally, in NAND flash devices and other solid-state memory devices, the smaller the node size and/or gate area of the individual memory cells, the smaller the number of electrons that may be stored in the floating gate of each memory cell, which may negatively impact the ability to correctly interpret the written data when read. Furthermore, in multi-level cell (MLC) programming schemes, multiple (two or more) bits of data may be stored in a single cell, further affecting the ability to correctly interpret programmed data. The desire to increase data density has led to smaller node sizes and proliferation of MLC-type programming schemes. Therefore, in view of such factors, data retention time at a given endurance threshold may be reduced. In addition, as solid-state memory is programmed and erased, each cycle may generally reduce the memory's data retention capability. Furthermore, data retention capability may be adversely affected by relatively high temperature encountered by memory cells after they have been written/programmed, including during periods where power is not applied to the device.

Data maintenance mechanisms, such as data refresh, garbage collection and/or the like, may be implemented to refresh the data stored in solid-state memory devices. For example, when it is determined that data is at risk of being lost based on known or estimated charge loss of the cells storing such data, the data may be read and rewritten in order to decrease the age of the written data. Such processes may substantially restart the data retention time clock and increase the likelihood that the data will be read successfully when requested. However, estimation of data retention charge loss may not be trivial, particularly where memory cells are exposed to unknown temperature levels and/or variations over a period of time, such as a period of time during which power is not supplied to the storage device. Certain embodiments disclosed herein provide a sensor which can be used to estimate the data retention state of the memory cells after a power off cycle. The sensor may advantageously take into account both time and temperature factors.

Certain embodiments of the present invention provide one or more electrical sensors that utilize floating gate technology as a basis for estimating the impact of time and/or temperature on a proximally-located solid-state memory array, or memory cells, over a period of time, substantially irrespective of whether power is supplied to the memory during such period. In certain embodiments, the sensor(s) are designed to provide a relatively large dynamic range and/or a relatively well-controlled relationship between time, exposed temperature and/or read voltage. According to one or more embodiments, the sensor may be reset while power is on, such that the sensor can repeatedly track the environmental impact on data retention during subsequent power-off cycles.

Data Storage System/Device

FIG. 1A is a block diagram illustrating an embodiment of a combination of a host system 110 with a data storage device 120 incorporating data retention charge loss estimation functionality using one or more sensors 150 in accordance with one or more embodiments disclosed herein. As shown, the data storage device 120 (e.g., hybrid hard drive, solid-state drive, any storage device utilizing solid-state memory, etc.) includes a controller 130 configured to receive data commands from the host system 110 and execute such commands in non-volatile solid-state storage 140 including solid-state memory cells. Such commands may include data read/write commands, and the like. The device controller 130 may be configured to receive data commands from a storage interface (e.g., a device driver) 112 residing on the host system 110. Data commands may specify a block address in the data storage device 120; data may be accessed and/or transferred based on such commands. In certain embodiments, the data storage device 120 may be a PCIe-based card-type storage device.

The data storage device 120 can store data received from the host system 110 such that the data storage device 120 acts as data storage for the host system 110. To facilitate this function, the controller 130 may implement a logical interface, wherein the logical interface can present to the host system memory as a set of logical addresses (e.g., sequential/contiguous addresses) where data can be stored. Internally, the controller 130 may map logical addresses to various physical memory addresses in the non-volatile solid-state storage 140 and/or other memory module(s). Mapping data indicating the mapping of logical addresses to physical memory addresses may be maintained in the data storage device 120. For example, mapping table data may be stored in non-volatile solid-state storage 140 in order to allow for re-creation of mapping tables following a power cycle.

The device controller 130 may include one or more memory modules (not shown), such as non-volatile memory (e.g., ROM) and/or volatile memory (e.g., RAM, such as DRAM). In certain embodiments, the device controller 130 may be configured to store information, including, for example, operating system(s) code, application code, system tables and/or other data, in the non-volatile solid-state storage 140 and/or other non-volatile memory such as a boot ROM not shown in the figure. On power-up, the device controller 130 may be configured to load such data for use in operation of the data storage device 120.

Data retention charge loss in solid-state memory cells can result in cells migrating across voltage state boundaries and thereby causing decoding errors. With respect to the solid-state storage 140, which may comprise NAND flash memory or the like, such storage may suffer to some degree from inherent issues with data retention charge loss, as described above. For example, data retention reliability may depend at least in part on node size and/or gate area of the respective solid-state memory cells. Data retention charge loss may be a function of both the amount of time since the data was written, as well as the temperature exposure of the memory cells, where higher temperature may generally result in greater charge loss. That is, when solid-state memory cells are written and subsequently exposed to relatively high temperatures, the amount of time that the written data can be retained may generally be reduced. The number of P/E (program/erase) cycles the memory has endured also has an effect on data retention charge loss. Such charge loss effects may occur while power is applied to the solid-state storage 140, as well as during power-down periods.

In certain embodiments, floating gate technology may be used as part of a sensor to estimate or predict the negative impact of time and/or temperature on at least a portion of the solid-state storage 140. Certain embodiments include one or more sensor(s) 150 may comprise one or more floating gate transistor devices that may be subjected to substantially similar time and/or temperature conditions as programmed memory cells, such that the data retention charge loss experienced by the sensor(s) may be at least partially representative of, and/or proportional to, the data retention charge loss of the programmed memory cells.

In certain embodiments, the sensor(s) 150 comprise a larger node size and/or gate area than the memory cells of the solid-state storage 140 in order to provide improved reliability. The larger node size and/or gate area may provide relatively better endurance and/or resistance to charge loss due to a number of aforementioned factors including higher temperatures. In certain embodiments, the sensor(s) 150 comprise one or more floating gate transistors having a node/gate size of approximately 40 nm. Alternatively, the sensor(s) 150 may have a node/gate size of 28 nm, 20 nm, 15 nm, or smaller.

The sensor(s) 150 may be integrated with the controller 130 or solid-state storage 140, or may be a discrete component of the data storage device 120. Because the floating gate(s) of the sensor(s) 150 may experience charge loss whether or not power is provided to the solid-state storage 140, the sensor(s) 150 may be used to provide a substantially power-independent basis for estimating time and/or temperature effects.

In certain embodiments, the sensor 150 is configured to provide information that may be used to determine exposed temperature including, e.g., cumulative temperature and/or peak temperature, experienced by the sensor 150 during a data retention time period. The data maintenance module 133 of the controller 130, or other component of the system 100, may be configured to use the information provided by the sensor(s) 150 as an input to determine when data maintenance operations, such as data refresh, garbage collection, wear leveling, or the like, are to be performed in order to compensate for the adverse effects of temperature on the ability of the solid-state storage 140 to retain data over time. The data maintenance module 133 may be configured to refresh at least some of the cells of the solid-state storage 140 to proactively preserve the integrity of the data stored thereon based on one or more of: P/E cycle count; data write time; power-on thermal profile; and/or power-off thermal profile. In certain embodiments, the information from the sensor(s) may be used by the data maintenance module 133 to adjust target program voltage levels and/or voltage read threshold levels for the solid-state storage 140.

As referenced above, various factors may influence the usefulness of solid-state memory. For example, the solid-state storage 140 (e.g., NAND flash) may be required to meet certain specifications for endurance and/or data retention. Data retention and endurance characteristics of a solid-state storage device may be generally considered to be inversely proportional. Furthermore, temperature may have an impact on both parameters. For example, the ability of the solid-state storage 140 to retain data over time may be affected by temperature exposure during each of the following periods, when the device is: powered-on and idle; powered-on and writing; powered-on and reading; and powered-off. In certain embodiments, the sensor(s) is/are configured to measure data retention integrity over time and temperature in each of the time periods listed above, including powered-off periods.

Figure 1B:
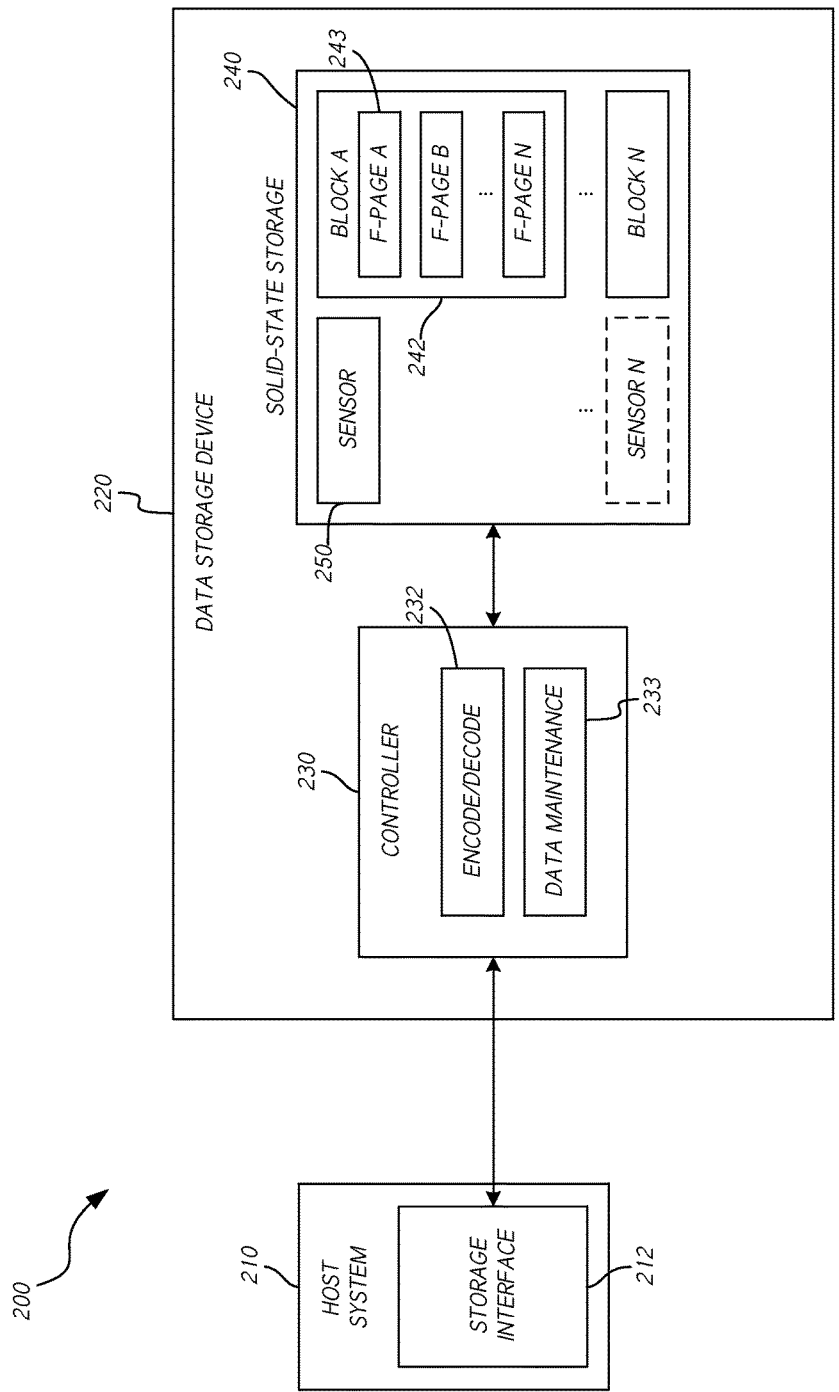

FIG. 1B is a block diagram of a system 200 comprising a data storage device 220, which may be similar in certain respects to the data storage device 120 shown in FIG. 1A and described above. The diagram of FIG. 1B shows that in certain embodiments a sensor device 250 according to embodiments disclosed herein may be associated with non-volatile storage of the data storage device 220, such as the solid-state storage module 240. For example, the solid-state storage module 240 may be a NAND flash chip, board, or other module. In certain embodiments, the sensor device 250 is disposed on the same chip, die, or board as the solid-state memory of solid-state storage module 240. For example, the solid-state storage 240 may be associated with a plurality of sensor devices, wherein each of the sensor devices is associated with a separate block or subset of solid-state memory units of the solid-state storage 240.

In certain embodiments, the sensor device 250 may be disposed on the same die as the solid-state memory array of the solid-state storage 240, but may comprise one or more floating gate transistors having a larger gate area than the memory cells of the memory array. In certain embodiments, the solid-state storage 240 comprises sensors on a block-by-block, superblock-by-superblock, or array-by-array basis. In such embodiments, the sensor(s) may be written at the same time as the corresponding block, superblock or array is written, and further erased at the same time the corresponding block, superblock or array is erased. In certain embodiments, one sensor is included for an entire board.

It is noted that while FIG. 1A depicts a generic controller 130 within a storage device, in one or more embodiments, some or all of the described components/functionalities of the controller 130 may be implemented as part of a storage device level controller (e.g., a SSD controller), a memory level controller (e.g., a NAND controller), or a combination of both. The same variations also apply to the controller 230 in FIG. 1B.

Figure 2:
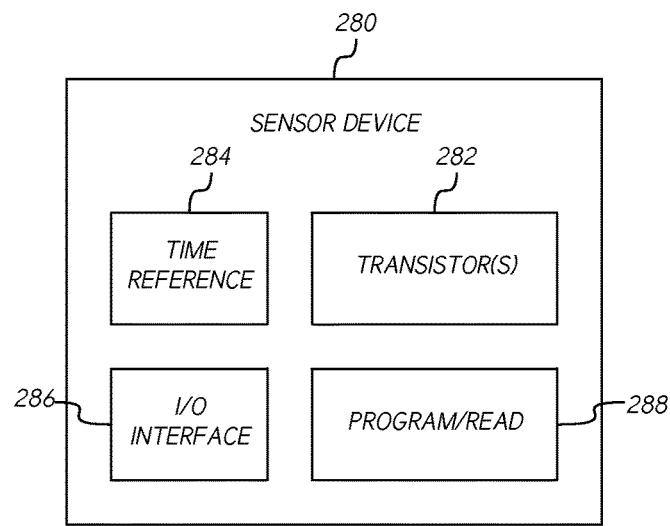
FIG. 2 is a block diagram representing a sensor device according to one or more embodiments.

FIG. 2 is a block diagram representing a sensor/sensor device 280 in accordance with one or more embodiments disclosed herein. The sensor device may include one or more transistor devices 282, such as floating-gate transistor devices, which may be similar in certain respects to floating-gate transistor devices implemented in solid-state storage devices. Therefore, the behavior and/or characteristics of the one or more transistors 282 may be at least partially representative of the behavior/characteristics of certain solid-state memory cells, and reference to the behavior/characteristics of the transistors 282 may therefore provide information that may be representative of similar behavior/characteristics of the solid-state memory cells.

The use of floating gate technology may provide a measure of the combination of time and temperature from the time the sensor device 280 is programmed to the time it is read. The sensor 280 may provide a measure of the data retention integrity of adjacent solid-state memory cells (e.g., NAND flash memory). In certain embodiments, once read, the sensor can be set again by erasing and/or charging the transistor(s) 282 in order to be reused, though reading is not a pre-requisite for a reset.

The transistor(s) 282 may be designed to have a relatively large electron storage capacity compared to the capacity of the solid-state memory cells for which the sensor device 280 is used as a reference. The tunnel oxide of the transistor(s) 282 may be inherently prone to leakage as temperature is increased. Before power is removed from the system, that is, while power is still available to be applied to the sensor 280, the sensor 280 may be set by charging the floating gate(s) of the transistor(s) 282 may be charged with electrons. When power is lost, the floating gate(s) may retain electrons with a relatively slow loss of electrons through the dielectric at low and room temperatures. However, when the temperature increases, the rate at which the electrons leak through the dielectric may increase. When power is reapplied to the sensor 280, the transistor(s) 282 may be read, wherein the read voltage of the cell(s) may be proportional to the combination of the elapsed time and/or the temperature experienced by the sensor 280 since the sensor was set. Such measurement may be used to determine an expected data retention state of solid-state memory cells in the same package, or attached to the same printed circuit board as the sensor 280. Once the data retention data point(s) have been collected, the floating gate(s) may again be set in order to track the time and temperature events for a subsequent time period, such as an off-cycle period.

Figure 3:
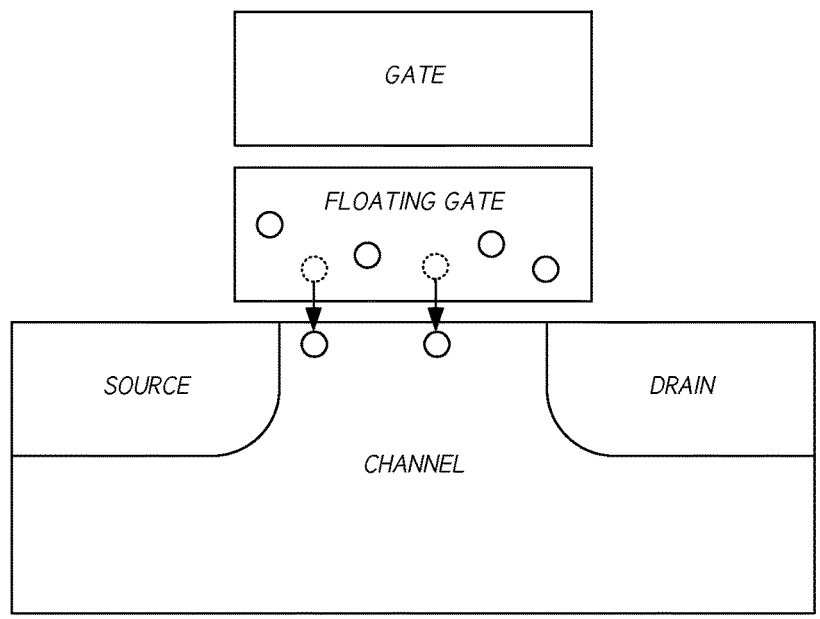
FIG. 3 is a cross-sectional view of an embodiment of a floating-gate transistor.

Charge loss in floating gate transistors may be better understood with reference to FIG. 3, which provides a cross-sectional view of an embodiment of a floating-gate transistor. As referenced above, floating-gate transistors can be used as charge-storing devices for maintaining data in a solid-state storage system. Floating-gate transistors may comprise an insulating oxide layer disposed between a "floating" gate and a semiconductor substrate. In certain embodiments, writing/programming the transistor cell can be performed by forcing electrons through the oxide layer by applying a high enough voltage to the gate. To erase a cell, the substrate well may be raised to a high enough voltage to force the electrons back through the oxide layer from the floating gate into the channel substrate. The cell may be read by applying a threshold voltage to the gate and sensing the current flowing in the transistor.

The repeated electron tunneling mechanism from writing and erasing the transistor cell can cause various physical degradation effects, which can affect the cell's ability to store charge. For example, one of the effects, loss of charges, can cause the cell's charge to decrease from the level set through the relevant program algorithm, leading to a potential "bit flip." Various factors may affect the effect of charge loss on data retention, such as, for example, time and temperature.

Because of charge loss and other effects, it may be desirable to implement data refreshing/scrubbing in solid state drive applications in order to refresh stored data (e.g., to other unused blocks) before the data retention degrades to the extent that data cannot be correctly read out. In addition to storage time, as referenced above, additional environmental factors may contribute to a solid-state drive's data retention characteristics. For example, temperature can adversely affect data retention characteristics, particularly with respect to heavily cycled blocks. In certain implementations, the temperature that a drive is subjected to during power-off periods may not be taken into consideration when determining when blocks of data should be refreshed. The ability of solid-state memory, such as NAND flash, to store and retain data can depends on the temperature that the memory is subjected to during writing, as well as between the time the data is written to the time the data is read. According to Arrhenius' equation, data retention acceleration caused by elevated temperatures is an exponential function, and therefore its effect can be significant.

With further reference to FIG. 2, the sensor device 280 may further include a program/read module 288, which may be configured to program/charge the one or more transistors 282 by applying a charge thereto, and further to read a charge level of the one or more transistors. Programming and/or reading of the transistors 282 may be at least partially directed by an input/output interface 286 of the sensor 280, which may be used to receive input from a user or system, and provide output thereto. The sensor device 280 may include control circuitry to receive commands/signals received via the I/O interface 286 and perform the actions described herein. For example, a host (e.g., controller 130 or 230, or another processor in non-data storage applications) coupled to the sensor device 280 may provide a signal directing the sensor 280 device to program the transistor(s) 282 to a certain charge level, such signal being communicated over the I/O interface 286. The host may further request a read of the transistors 282, wherein the program/read module 288 may read a charge level of one or more of the transistor(s) 282 and provide the charge level reading to the host over the I/O interface 286. In certain embodiments, the sensor device 280 further comprises a time reference module 284, which may be any type of device or component configured to provide information relating to time, such as a real-time clock, or other device or component. The time reference 284 may provide additional information by which the read voltage level of the transistor(s) 282 may be interpreted by a host or user to estimate charge loss of solid-state memory cells associated with the sensor device 280.

The sensor 280 can be an individual discrete component, a single sensor contained within a solid-state memory device, or may comprise a separate sensor per a sub-division of solid-state memory (e.g., block, superblock, etc.), depending on the implementation. Embodiments comprising block-by-block sensor correspondence may advantageously allow for the accounting of block program/erase count information as well. In such embodiments, the sensor transistors may be erased and programmed in connection with erases and programs of the memory blocks with which they are associated, thereby yielding a similar erase count for the sensor as for the block of memory being tracked.

In certain embodiments, the sensor device 280 may be used to detect temperature excursions beyond the specifications of the device with which it is associated. Such information may be used to indicate warranty voiding due to excessive temperature exposure. In certain embodiments, a real-time clock may be utilized to determine temperature information to such particularity. Although the sensor device 280, and related devices, are disclosed herein in the context of data storage devices, the sensor device 280 may be utilized in any application in which determination of cumulative or other temperature information is desired.

Read Errors Due to Charge Loss

Figure 4:
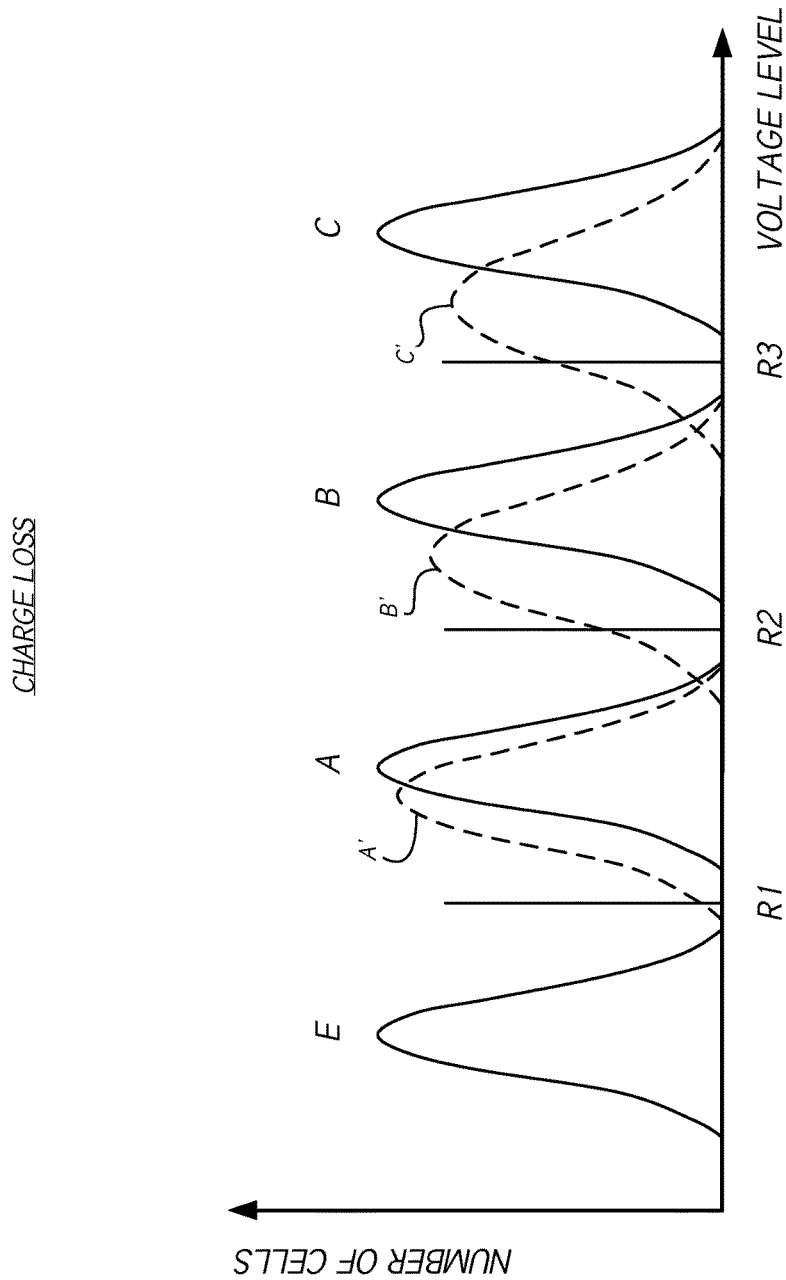
FIG. 4 is a graph showing a probability distribution of cells showing possible data retention related charge loss according to one or more embodiments.

Over time, memory degradation and the like can cause the states of a voltage distribution to widen and overlap voltage read levels. FIG. 4 illustrates a graph showing a probability distribution of cells in a non-volatile memory array according to an embodiment. The illustration of FIG. 4 corresponds to a multi-level cell (MLC) programming scheme, which, as used herein, refers a scheme in which cells of solid-state memory are programmed to store a charge level representative of two or more bits of data (two bits per cell, three bits per cell, four bits per cell, etc.). Additionally or alternatively, embodiments disclosed herein may be applicable to systems implementing single-level cell (SLC), or other programming scheme.

FIG. 4 shows four programming states: an erased state ('E'), and three programmed states ('A,' 'B,' 'C'), wherein each state may represent one possible value for two bits of data. In decoding memory cells, one or more reference voltage levels, referred to herein as "voltage read levels," may be used to read the cells to determine what charge state the cells are in. FIG. 4 illustrates three voltage read levels, R1, R2 and R3.

FIG. 4 shows a shifted voltage distribution in dotted lines compared to a freshly-programmed distribution, illustrated with solid lines. As shown, some of the programming states have crossed over adjacent read threshold(s), such as in response to charge loss during a data retention period, which can have a negative effect on the ability to correctly decode the programmed data. For example, as one voltage distribution widens towards another, the charge of a memory cell may cross the relevant read threshold, causing a bit to "flip" from '0' to '1', or vice versa. The widened distributions (A, B, C) in FIG. 4 show the potential impact of retention related charge loss on the voltage state distributions. As shown, in certain embodiments, a highest voltage state (C) may experience the greatest migration of cells to the left towards the lower voltage states during a data retention period. Over time, the retention related charge loss may worsen, particularly with respect to devices that have experienced a high number of P/E cycles, and/or excessively-high temperatures.

Figure 5:
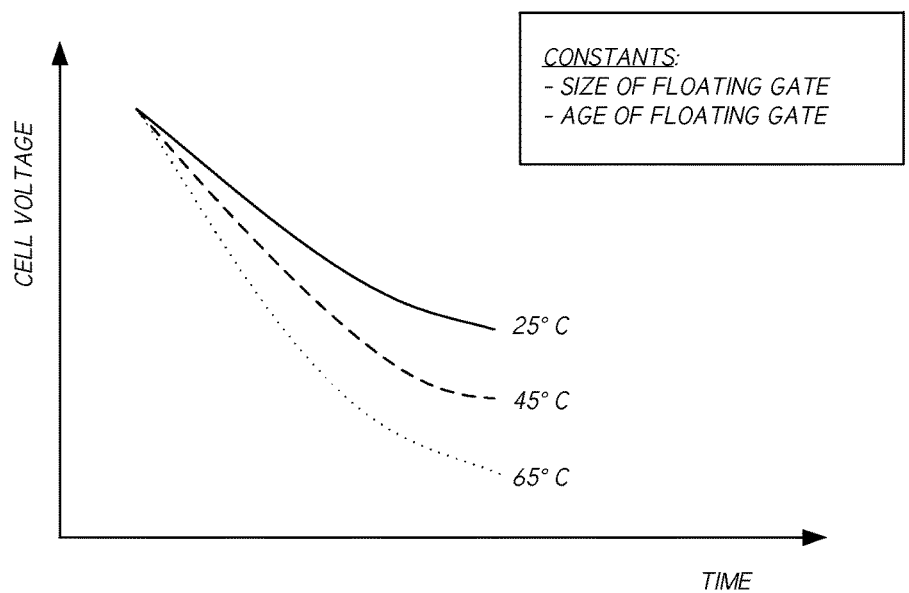
FIG. 5 is a graph showing potential charge loss in solid-state memory devices according to one or more embodiments.

FIG. 5 is a graph showing potential charge loss in solid-state memory devices according to one or more embodiments. The graph of FIG. 5 illustrates that, in certain embodiments, the charge loss of solid-state memory cells may be affected to some degree by a temperature to which the memory cells are exposed. For example, as shown, drop in cell voltage (i.e., data retention charge loss) may be greater for a memory cell subjected to temperatures of 65° C. than for a comparable memory cell exposed to lower temperatures of, for example, 45° C., and to an even greater extent relative to exposure at 25° C. The behavior represented in FIG. 5 may be representative of relative charge loss among memory cells having similar floating gate size and/or floating gate age characteristics.

Figure 6:
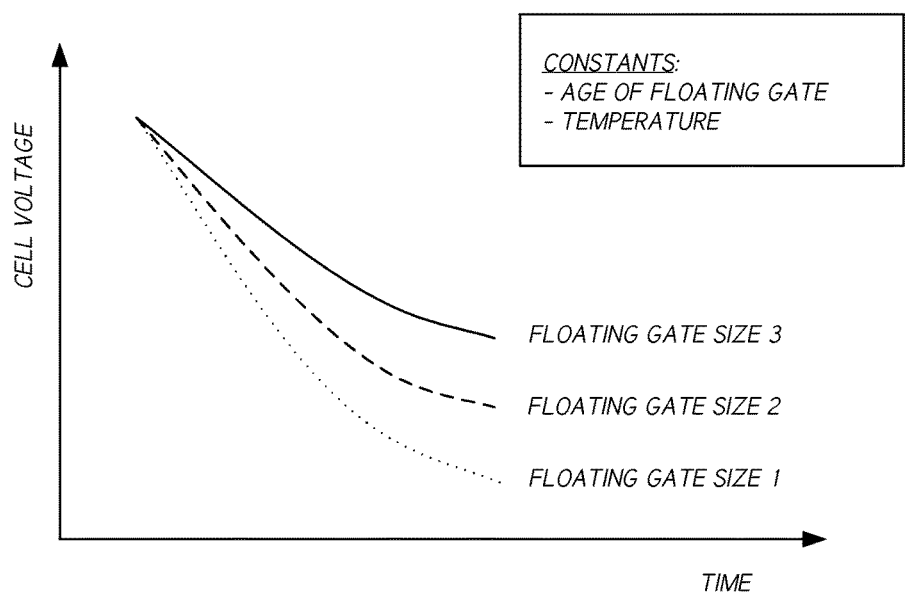
FIG. 6 is a graph showing potential charge loss in solid-state memory devices according to one or more embodiments.

FIG. 6 is a graph showing potential charge loss in solid-state memory devices according to one or more embodiments. The graph of FIG. 6 illustrates that, in certain embodiments, the charge loss of solid-state memory cells may be affected to some degree by a floating gate size of the cells. For example, as shown, drop in cell voltage (i.e., data retention charge loss) may be greater for a memory cell having a first (e.g., smaller, size 1 as shown) floating gate size than for a comparable memory cell having a second (e.g., larger, size 2 or 3 as shown) floating gate size. The behavior represented in FIG. 6 may be representative of relative charge loss among memory cells having similar temperature exposure and/or floating gate age characteristics.

FIGS. 5 and 6 are simplified examples reflective of the type of characterization that may be performed on a sensor's cell(s) to enable determination of data such as exposure temperature when the sensor is in use. Because of the physical relationships of (1) the aforementioned factors contributing to charge loss and (2) the actual charge loss, characterization of the sensor's cells may yield mathematical functions/curves and/or lookup tables upon which measured charge loss can be translated to an approximation of factor(s) contributing to charge loss. For example, measured cumulative charge loss coupled with a known data retention duration may yield an approximation of cumulative exposure temperature, measured cumulative charge loss coupled with a known cumulative exposure temperature may yield a data retention duration, and so on. In addition, while the cell's age (in terms of P/E cycles experienced) is assumed to be constant in FIGS. 5 and 6, a sensor may be re-characterized (e.g., upon reaching certain P/E cycle threshold) to recalibrate its current sensitivity to charge loss in view of varying environmental factors. In certain embodiments, the sensor's characterization, coupled with data retention characterization of its associated solid-state memory, enables a controller to determine when data refresh may be needed in the solid-state memory. The process of such characterization and its usage are further described below in conjunction with FIG. 9.

As referenced above, floating gate size (e.g., gate area) may dictate the number of electrons that can be stored in the floating gate. However, the leak rate associated with a solid-state memory cell may also be affected by other factors, such as the particular dielectric design.

The design of floating gate transistor sensors according to embodiments disclosed herein may be based on a desired fidelity and/or range of the sensor. For example, a relatively smaller gate area may be used where relatively better fidelity is desired, whereas a relatively bigger gate area may be used where relatively wider range is desires. In certain embodiments, a sensor includes a plurality of transistors having different gate areas, which may provide improved depth and/or diversity of information/performance. In certain embodiments, a sensor may include a plurality of transistors having similar gate areas, and data retention may be determined based on some combination of the results from the transistors (e.g., average, eliminating the highest and/or lowest results, etc.).

Sensor Utilization Processes

Figure 7:
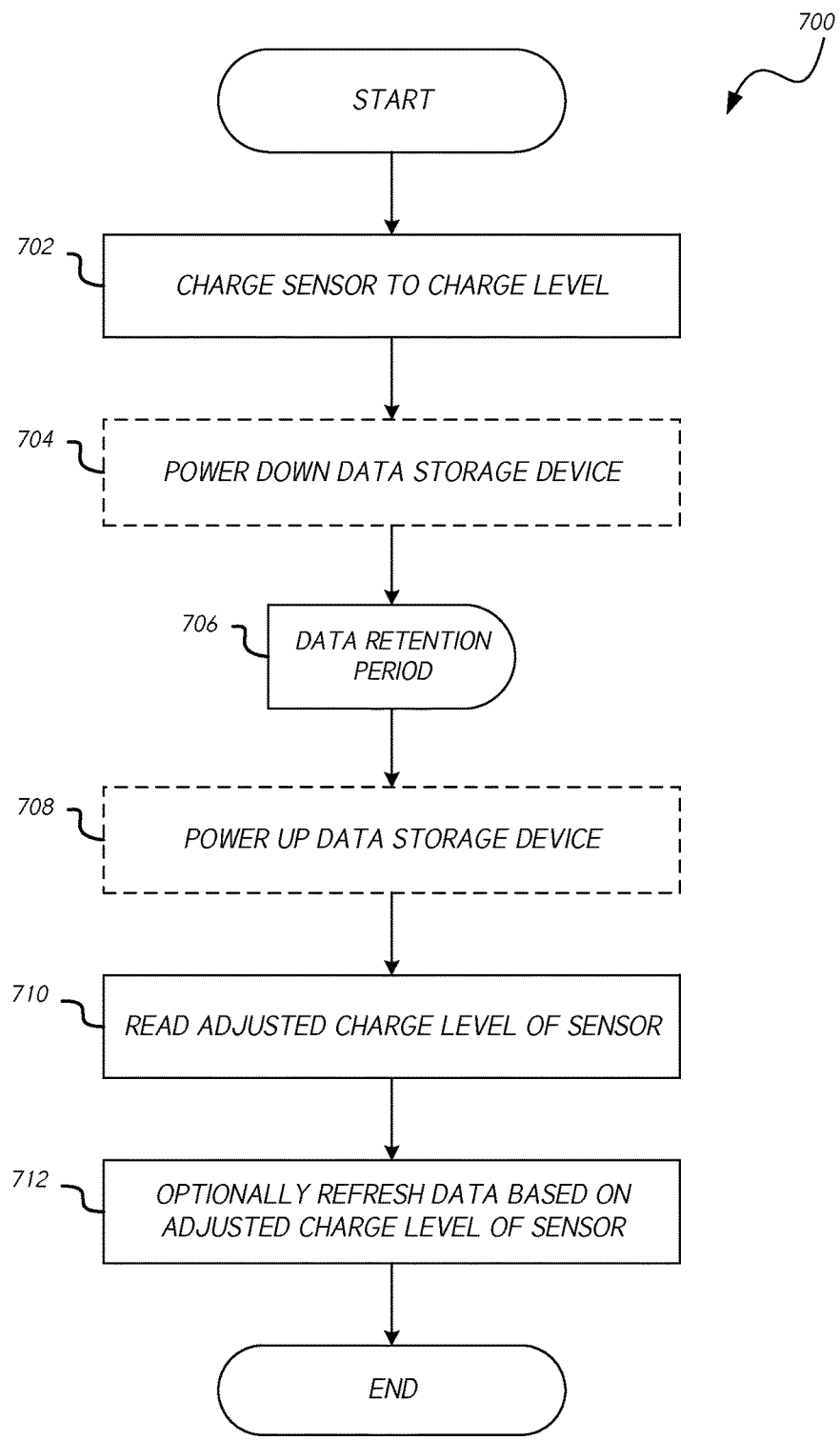
FIG. 7 is a flow diagram illustrating a process of utilizing an electrical sensor according to one or more embodiments.

FIG. 7 is a flow diagram illustrating a process 700 of utilizing an electrical sensor according to one or more embodiments. A block 702, the process 700 involve charging a sensor to a certain charge level. For example, the sensor may be disposed in proximity to, or otherwise be associated with, one or more solid-state memory cells, which are desired to be monitored for charge loss effects. The sensor may comprise a floating gate transistor, which may be charged with electrons to produce the desired charge level.

In certain embodiments, the sensor may comprise an array of floating gate transistors having a variety of sizes/gate areas, which may be used in order to produce a desired fidelity at different points along a dynamic range of the data storage device. In certain embodiments, larger floating gates may provide fidelity at the long data retention period and/or high temperature ends of the spectrum, whereas smaller floating gates may provide fidelity at the short data retention period and/or low temperature ends of the spectrum. By reading the entire array of floating gates, the sensor may provide a higher degree of accuracy than if a single floating gate were to be used. In certain embodiments, where the sensor comprises a plurality of transistors, each of the floating gates may be relatively large, where the leakage rate of the tunnel junction may be varied in order to produce a wide dynamic range with high fidelity.

After the sensor has been charged, in certain embodiments, the process 700 involves powering-down a data storage device associated with the one or more solid-state memory cells being monitored. However, it should be understood, that the process 700 may or may not involve powering-down the data storage device, as shown at block 704.

At block 706, the process 700 involves the elapsing of a data retention period of time. For example, the data retention period may correspond to a period of time in which the data storage device is without power. However, although certain embodiments are disclosed herein in the context of data retention periods during a powered-down state of a data storage device, relevant data retention periods may be any period of time during which it may be desirable to assess the temperature and/or time exposure of one or more solid-state memory cells.

Where the data storage device has been powered-down, after the data retention period, illustrated at block 706, block 708 may represent power-up of the data storage device. However, as described above, the process 700 may be implemented with or without the powering-down and/or powering-up steps illustrated in the diagram of FIG. 7.

At block 710, the process 700 involves reading an adjusted charge level of the sensor after the data retention period. For example, during a data retention period, solid-state memory cells may have experienced some degree of charge loss, which may have been affected by one or more factors, such as the amount of time of the data retention period, the temperature exposure of the solid-state memory over the data retention period, and/or other factors.

At block 712, the process 700 involves optionally refreshing data associated with the solid-state memory cells based on the adjusted charge level of the sensor read at block 710. For example, the amount of charge loss demonstrated by the adjustment in charge level of the sensor after the data retention period may provide information indicating the extent of data retention charge loss experienced by the solid-state memory cells. In one embodiment, block 712 may include determining a data refresh schedule for the non-volatile solid-state memory cells based at least in part on the determined adjusted charge level, and refreshing the memory cells according to the data refresh schedule.

The information associated with the adjusted charge level read at block 710 may be utilized for any desirable purpose. For example, such information may be useful in determining when and/or how to implement data refreshing maintenance operations for the solid-state memory. In certain embodiments, if charge loss beyond a certain threshold amount is experienced by the sensor over the data retention period, recognition of such charge loss may trigger scheduling and/or execution of data refreshing or other maintenance operations, such as garbage collection, wear leveling, or the like.

By properly refreshing data based on the sensor reading(s), the system data integrity may be significantly improved. In the absence of a measure of data retention integrity, refresh algorithms may not be sufficiently optimized, resulting in adverse system performance. Since endurance and data retention may be considered to be substantially inversely related, improvement in the data retention achieved through implementation of the process 700 may be translated to specify higher system endurance in certain embodiments. Higher system endurance may be advantageous in marketed products, and may reduce the amount of storage overprovisioning required in the product.

Figure 8:
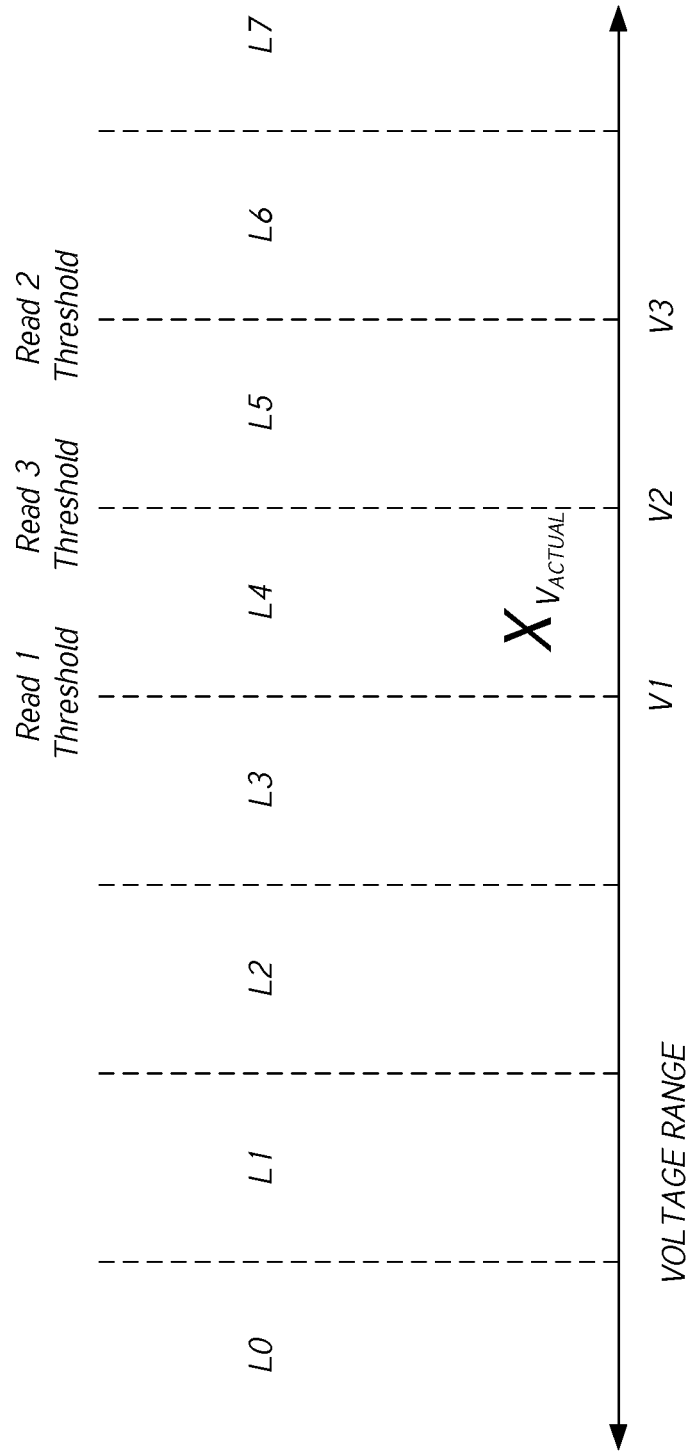
FIG. 8 is a diagram representing an example binary search read mechanism according to one or more embodiments.

FIG. 8 is a diagram representing an example binary search read mechanism according to one or more embodiments, which may be utilized to determine a charge level present on a transistor sensor as described herein. For example, the sensor device may be a floating gate transistors device, or may comprise a plurality of floating gate transistors devices. As shown, if the sensor device has a charge level represented by the 'X' reference position in the diagram, an eight-level resolution binary search read may result in a determination that the voltage of the cell is in the voltage range labeled L4, between voltage points V1 and V2.

The sensing circuit used to read the voltage from the floating gate(s) of a sensor as described herein may be different from that used to read the associated solid-state memory array. In certain embodiments, the charge level on the sensor may be read directly, rather than through multiple reads at discrete voltage read levels as shown in FIG. 8. For example, the sensor read may be performed using one or more analog-to-digital (A/D) converters (e.g., high-impedance A/D converter to avoid substantial draining of the sensor cell), comparators, or the like.

As represented in FIG. 8, in certain embodiments, the sensor charge level is read using a series of voltage thresholds and a binary search to find a crossover point, in a similar manner as may generally be used to decode data stored in solid-state memory cells, with the exception that the number of possible states may be higher than a standard memory cell read. A higher number of states may provide a higher resolution/sensitivity to detect slight charge loss, which can then be correlated to data retention information such as exposure temperature, as discussed above. In a multi-cell sensor configuration, as the number of transistor cells used in the sensor is increased, the number of states per cell may be able to be decreased while retaining similar detection capability. A reduced number of states per cell reduces the number of reads that may be needed in a binary search, and thus enables a quicker resolution of cell voltage and determination of the relevant data retention data.

The determination of which voltage range the actual value of the sensor is in may be performed using a discrete number of reads of the sensor cell at various voltage read levels, as illustrated in FIG. 8 as dashed vertical lines. For example, a first read may be performed at a central voltage read level, which may correspond to the voltage V1. Such read may determine that the actual voltage of the sensor cell is greater than the "Read 1 Threshold" level, or the voltage value V1. A second read may be performed at a second read threshold in the region of the voltage range that is greater than V1. In the particular example, the second read threshold at V3 may determine that the value of the sensor cell voltage is less than V3, and is therefore between the values V1 and V3 based on the first read and the second read. A third read at a third read threshold level V2 may subsequently be performed, which may reveal that the sensor cell voltage is less than the value V2, and therefore is in the range of voltage values between the value V1 and the value V2. Therefore, in the example of FIG. 8, only three reads of the sensor cell may be necessary to determine the voltage level of the sensor cell with the degree of granularity illustrated in the figure. In certain embodiments, the higher the number of read levels used, the better the fidelity of the sensor read. Although eight voltage levels are illustrated in the embodiment of FIG. 8, it should be understood that any number of levels may be implemented within the scope of the present disclosure.

Figure 9:
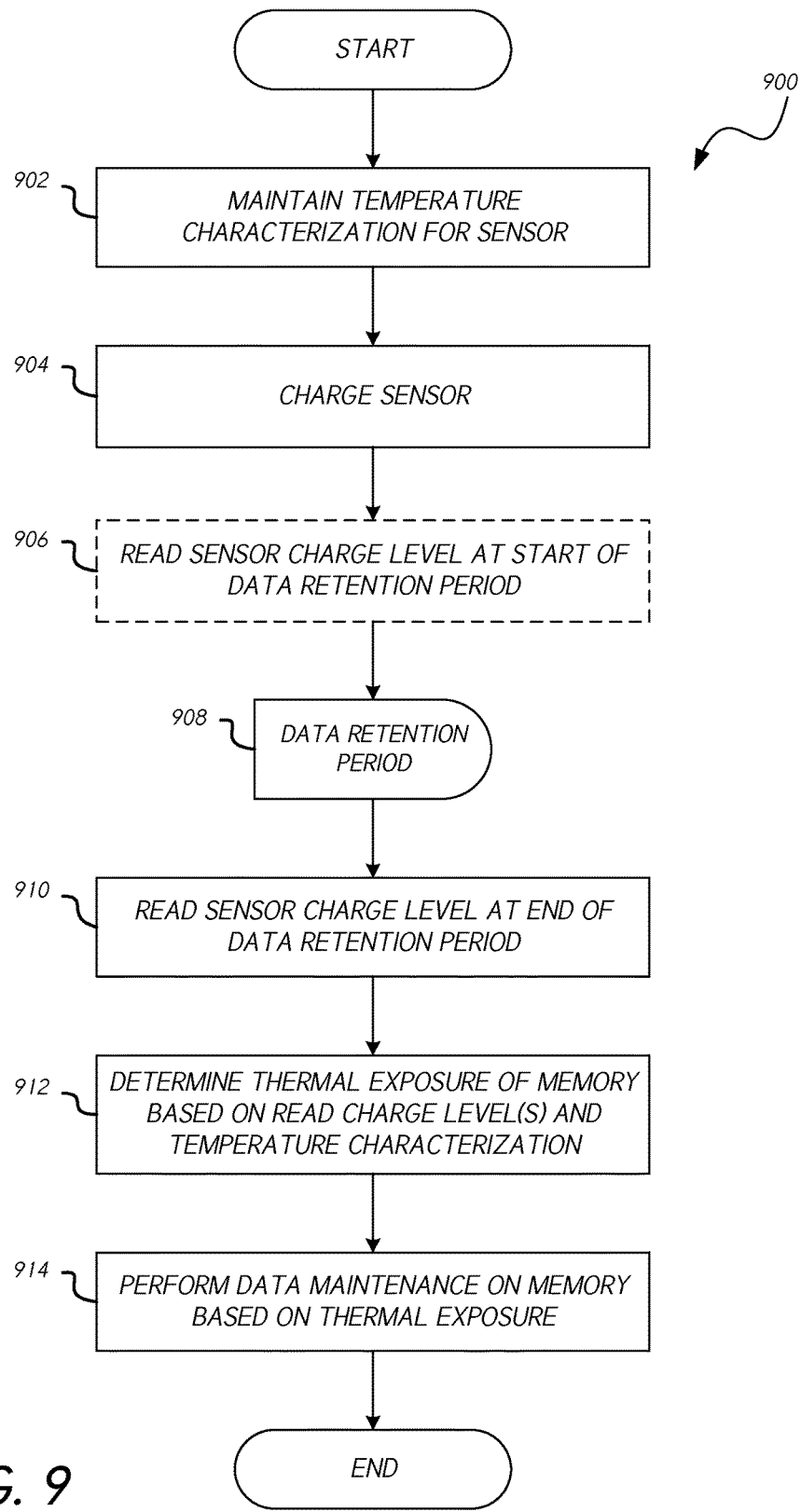
FIG. 9 is a flow diagram illustrating a process of utilizing an electrical sensor according to one or more embodiments.

FIG. 9 is a flow diagram illustrating a process of utilizing an electrical sensor according to one or more embodiments. At block 902, the process 900 involves maintaining temperature characterization data for a sensor device. For example, the characterization data may provide information relating to a voltage response of the sensor device to various time and/or temperature environments and/or factors. The characterization data may comprise one or more voltage shift curves or data (such as those shown in FIGS. 5 and 6), or the like. In certain embodiments, characterization data characterizing the solid-state memory array may also be maintained and used in combination with the sensor characterization data to estimate a data retention charge loss state of the solid-state memory array.

At block 904, the process 900 involves charging the sensor to a certain charge level. At block 906, the process 900 may involve reading the charge level of the sensor at the start of a data retention period, wherein the data retention period is represented by the block 908. However, where the charge of the sensor at block 904 is performed in connection with the beginning of the data retention period represent by the block 908, it may not be necessary to perform the read of the sensor charge level at block 906, as the charge level may effectively be known to be sufficiently close to the initial level to which the cell of the sensor was charged at block 904.

After the data retention period, which is represented by block 908, the process 900 may involve reading the sensor charge level at block 910. Because the charged cell of the sensor device may inherently suffer from some degree of charge loss over periods of data retention, the read of the sensor charge level at block 910 may return a charge level that is less than the charge level initially charged to the sensor at block 904.

Based on the reduction in charge level of the sensor determined by reading the sensor at block 910, the process 900 may further involve, at block 912, determining the thermal exposure of solid-state memory associated with the sensor device, or disposed in relative proximity thereto, based at least in part on the read charge level and/or the temperature characterization of the sensor and/or memory maintained as represented the block 902. At block 914, the process 900 may involve performing data maintenance on the solid-state memory based on the determined thermal exposure.

Figure 10:
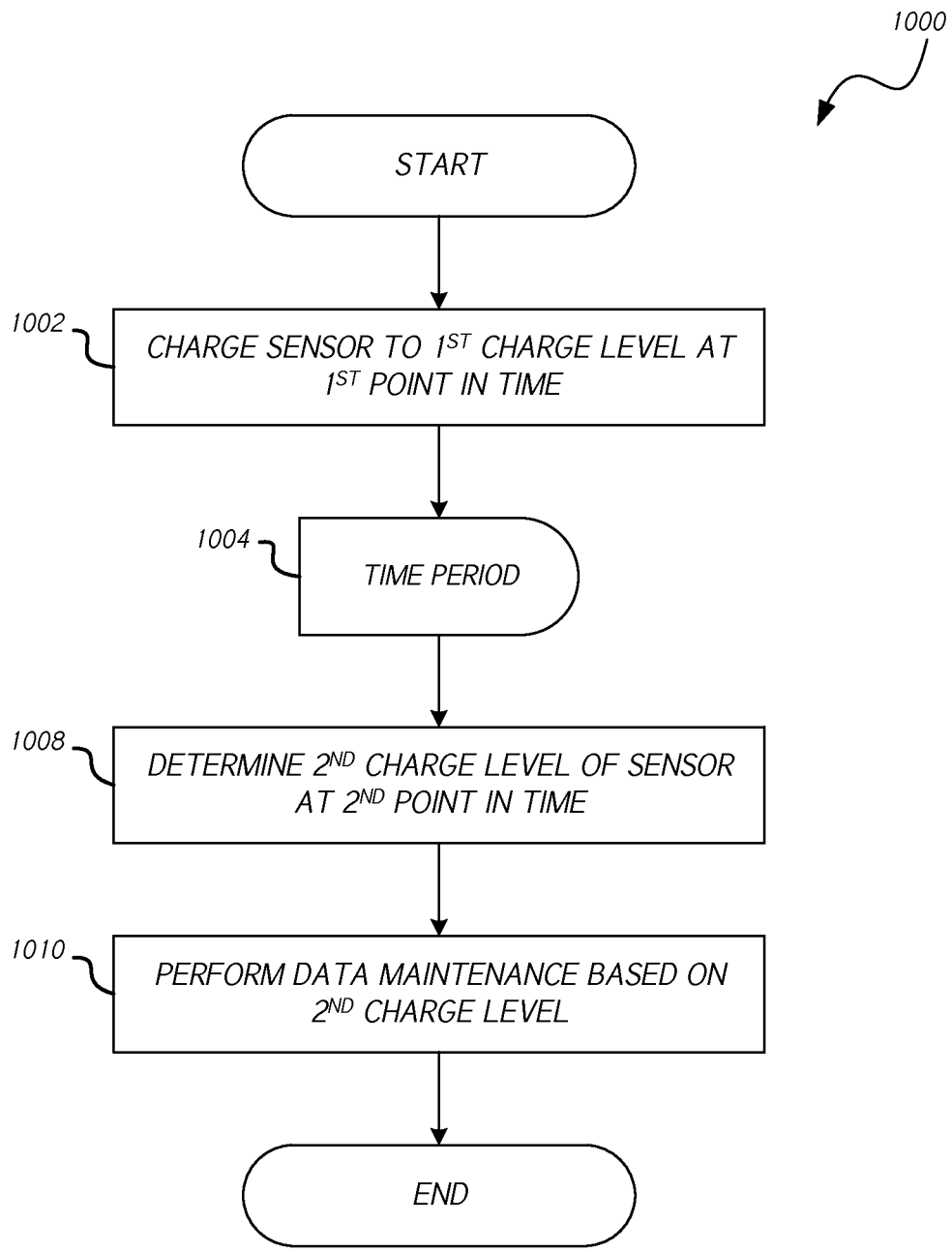
FIG. 10 is a flow diagram illustrating a process of utilizing an electrical sensor according to one or more embodiments.

FIG. 10 is a flow diagram illustrating a process of utilizing an electrical sensor according to one or more embodiments. At block 1002, the process 1000 involves charging a sensor device to a first charge level at a first point in time. After a time period, which is represented by the block 1004, the process 1000 may involve determining a second charge level of the sensor at block 1008 at a second point in time following the time period. At block 1010, the process 1000 involves performing data maintenance on solid-state memory cells based on the second charge level, which may be less than the first charge level by some amount as a result of data retention charge loss experienced during the time period represented by block 1004.

Additional Embodiments

Those skilled in the art will appreciate that in some embodiments, other types of charge level sensor devices can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
   a solid-state non-volatile memory comprising a plurality of memory cells;
   a sensor comprising one or more floating-gate transistors configured to hold an electric charge; and
   a controller configured to:
      charge the one or more floating-gate transistors to a first charge level at a first point in time;
      determine a second charge level of the one or more floating-gate transistors at a second point in time, after a powered-down time period after the first point in time, wherein the data storage device is powered-down during the powered-down time period; and
      refresh data stored in the plurality of memory cells based at least in part on the determined second charge level;
   wherein the second charge level is indicative of data retention charge loss in the plurality of memory cells during the powered-down time period.

2. The data storage device of claim 1, wherein the controller is further configured to determine a cumulative charge loss of the plurality of memory cells based on the first charge level, the second charge level, and a temperature characterization of the sensor that associates a floating-gate size of at least one of the one or more floating-gate transistors with cell voltage and time.

3. The data storage device of claim 2, wherein the controller is further configured to refresh the data based on the determined cumulative charge loss.

4. The data storage device of claim 1, wherein the sensor is configured to provide one or more of temperature information and time information associated with the powered-down time period.

5. The data storage device of claim 1, wherein the solid-state non-volatile memory comprises a plurality of blocks of memory, wherein the data storage device further comprises a separate sensor associated with each of the plurality of blocks of memory.

6. The data storage device of claim 1, wherein the controller is further configured to maintain a program/erase (P/E) cycle count of the sensor that is the same as a P/E cycle count of a block of memory of the solid-state non-volatile memory that is associated with the sensor.

7. The data storage device of claim 1, wherein the controller is further configured to determine the second charge level of the sensor in response to the solid-state non-volatile memory being powered: on.

8. The data storage device of claim 1, wherein the sensor is a discrete device separate from the solid-state non-volatile memory.

9. The data storage device of claim 1, wherein the controller is further configured to adjust at least one voltage read level for decoding the plurality of memory cells based on the second charge level of the sensor.

10. The data storage device of claim 1, wherein the plurality of memory cells comprise floating gate transistors having a first gate area and the sensor comprises a floating gate transistor having a second gate area that is larger than the first gate area.

11. The data storage device of claim 1, wherein the one or more floating-gate transistors comprises a plurality of floating-gate transistors.

12. The data storage device of claim 1, wherein a first gate area of a first of the one or more floating-gate transistors is smaller than a second gate area of a second of the one or more floating-gate transistors.

13. The data storage device of claim 12, wherein a third of the one or more floating-gate transistors has a third gate area greater than both the first and second gate areas.

14. The data storage device of claim 12,
   wherein determining the second charge level comprises:
      determining a charge level associated with the first of the one or more floating-gate transistors when the powered-down time period is shorter than a predetermined threshold; and
      determining a charge level associated with the second of the one or more floating-gate transistors when the powered-down time period is longer than the predetermined threshold.

15. The data storage device of claim 1, wherein the controller is further configured to:
   decode the plurality of memory cells using a first number of voltage read levels; and
   determine the second charge level using a second number of voltage read levels;
   wherein the second number of voltage read levels is greater than the first number of voltage read levels.

16. The data storage device of claim 1, further comprising a real-time clock configured to operate when the controller is in the powered-down state, wherein the controller is further configured to perform said refreshing of the data based in part on a signal received from the real-time clock.

17. The data storage device of claim 1, wherein the sensor comprises circuitry for outputting a signal representing a charge level of the sensor, and the controller is further configured to perform a direct read of the signal to determine the second charge level.

18. An electronic sensor device comprising:
   one or more floating-gate transistors configured to hold an electric charge;
   an input/output (I/O) interface for communicating with a host device;
   control circuitry configured to:
      receive a command from the host device to charge the one or more floating-gate transistors to a first charge level at a first point in time;
      determine a second charge level of at least one of the one or more floating-gate transistors at a second point in time after the first point in time, wherein the second point in time and the first point in time are separated in time by at least a powered-down time period; and
      provide the second charge level to the host device over the I/O interface.

19. The electronic sensor device of claim 18, wherein the one or more floating-gate transistors includes a plurality of floating-gate transistors, wherein a first of the plurality of floating-gate transistors has a greater leakage rate than a second of the plurality of floating-gate transistors.

20. The electronic sensor device of claim 18, further comprising a time reference.

21. The electronic sensor device of claim 18, wherein the control circuitry is further configured to provide temperature information based on the first and second charge levels.

22. The electronic sensor device of claim 18, wherein a charge leakage in a floating gate of the one or more transistors is at least partially temperature dependent, wherein the charge leakage is greater at a first temperature than it is at a second temperature, the second temperature being lower than the first temperature.

23. A method of performing data refresh operations in a data storage device, the method comprising:
   charging a sensor device to a first charge level at a first point in time;
   determining a second charge level of the sensor device at a second point in time after a powered-down time period after the first point in time;
   determining a data refresh schedule for non-volatile solid-state memory cells of the data storage device based at least in part on the determined second charge level; and
   refreshing the non-volatile solid-state memory cells according to the data refresh schedule.

24. The method of claim 23, further comprising powering-down the data storage device after the first point in time and before the second point in time.

25. The method of claim 23, further comprising determining a cumulative charge loss of the non-volatile solid-state memory cells during the powered-down time period based on the first charge level, the second charge level, and temperature characterization data of the sensor device.

26. The method of claim 23, wherein the sensor device comprises a floating: gate transistor, wherein the first charge level is a charge level on a floating gate of the floating: gate transistor.

* * * * *